US 9,559,511 B2

(12) United States Patent
Zink

(10) Patent No.: US 9,559,511 B2
(45) Date of Patent: Jan. 31, 2017

(54) CIRCUIT ASSEMBLY FOR ERROR INDICATING

(75) Inventor: Fabian Zink, Detmold (DE)

(73) Assignee: Phoenix Contact GmbH & Co. KG (DE)

( * ) Notice: Subject to any disclaimer, the term of this patent is extended or adjusted under 35 U.S.C. 154(b) by 1509 days.

(21) Appl. No.: 12/601,212

(22) PCT Filed: May 21, 2008

(86) PCT No.: PCT/EP2008/004065
§ 371 (c)(1),
(2), (4) Date: Apr. 19, 2010

(87) PCT Pub. No.: WO2008/141814
PCT Pub. Date: Nov. 27, 2008

(65) Prior Publication Data
US 2010/0207637 A1    Aug. 19, 2010

(30) Foreign Application Priority Data
May 22, 2007    (DE) .................. 10 2007 024 015

(51) Int. Cl.
*H02H 3/04*    (2006.01)
*G01R 31/02*    (2006.01)
(Continued)

(52) U.S. Cl.
CPC ............ *H02H 3/04* (2013.01); *G01R 19/0092* (2013.01); *G01R 31/02* (2013.01); *G01R 31/024* (2013.01); *G01R 31/025* (2013.01); *G01R 31/28* (2013.01)

(58) Field of Classification Search
CPC ....... G01R 31/28; G01R 31/02; G01R 31/024; G01R 31/025; G01R 19/0092; H02H 3/04
(Continued)

(56) References Cited

U.S. PATENT DOCUMENTS 4,792,910 A    12/1988 Lange
4,931,778 A    6/1990 Guajardo
(Continued)

FOREIGN PATENT DOCUMENTS

DE    9411459 U1    11/1994

OTHER PUBLICATIONS

PCT, International Search Report and Written Opinion, International Application: PCT/EP2008/004065, Oct. 1, 2008.
(Continued)

*Primary Examiner* — Jermele M Hollington
*Assistant Examiner* — Christopher McAndrew
(74) *Attorney, Agent, or Firm* — Kaplan Breyer Schwarz & Ottesen, LLP

(57) ABSTRACT

Circuit configuration for error reporting, having a signal transmitter (1) for issuing error signals, having an error reporting line (46) that is connected with an error report evaluation device (6), having a coupler (2) for galvanic separation of the error reporting line (46) from the signal transmitter (1), and having a power supply (5) for making available an operating voltage for the coupler (2).

A connection circuit (3) is provided between coupler (2) and error reporting line (46), which places the error reporting line (46) at a predetermined potential, the error report potential, if the operating voltage of the coupler (2) is insufficient.

The connection circuit (3) can furthermore be controlled by the coupler (2), in such a manner that if the signal transmitter (1) issues an error signal, the connection circuit (3) places the error signal onto the error reporting line (46).

5 Claims, 1 Drawing Sheet

(51) Int. Cl.
    *G01R 31/28* (2006.01)
    *G01R 19/00* (2006.01)
(58) Field of Classification Search
    USPC .......................................................... 324/537
    See application file for complete search history.

(56) References Cited

U.S. PATENT DOCUMENTS

| | | | | |
|---|---|---|---|---|
| 5,237,480 | A * | 8/1993 | Dara | H02H 3/087 |
| | | | | 361/42 |
| 5,784,268 | A * | 7/1998 | Steffek | H02M 7/48 |
| | | | | 307/46 |
| 2007/0103828 | A1* | 5/2007 | Larson | H02H 3/04 |
| | | | | 361/88 |
| 2011/0028104 | A1* | 2/2011 | Giombanco | H04L 25/0266 |
| | | | | 455/78 |

OTHER PUBLICATIONS

A. Colombo, "Application No. PCT/EP2008/004065 Written Opinion on the International Searching Authority", Oct. 13, 2008, Publisher: PCT, Published in: EP.
"Related EP Patent Application No. EP 08 758 670.7 Office Action", Dec. 12, 2013, Publisher: EPO, Published in: EP.
Dipl.-Ing. M. Muller, "German Office Action" dated Jan. 28, 2008 issued in counterpart German patent application No. 102007024015.7, Published in: DE.
"Lambda-Transmitter LT 1", "Sensoren and Systeme fur de Feuerungstechnik", Publisher: Lamtec Leipzig GmbH & Co. KG, Published in: DE.

* cited by examiner

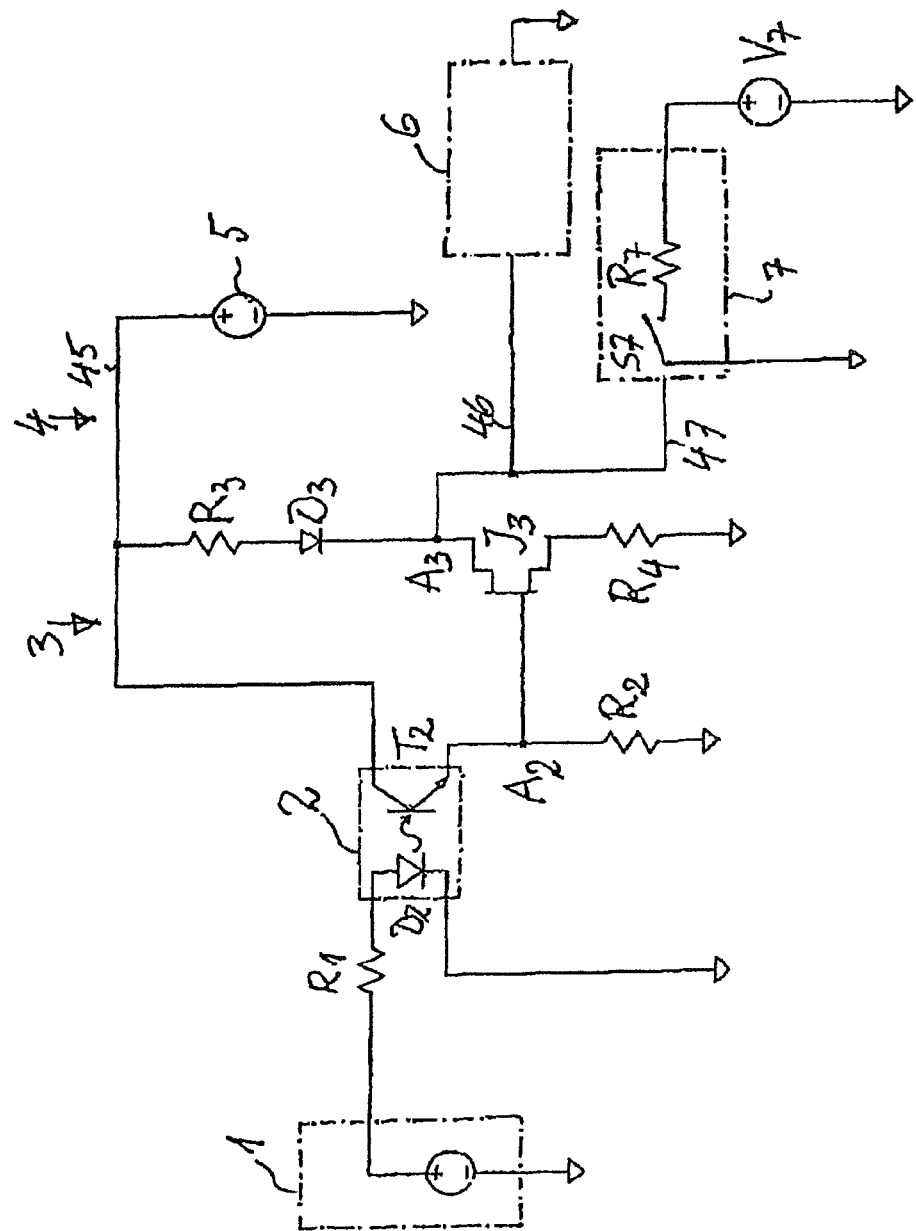

CIRCUIT ASSEMBLY FOR ERROR INDICATING

FIELD OF THE INVENTION

The invention relates to a circuit assembly for error indicating.

BACKGROUND OF THE INVENTION

It is known to use relay couplers or optical couplers for issuing a message or an indication on the error indicating line when an error occurs. Such couplers also serve to carry out galvanic separation of different parts of the circuit configuration. In the case of optical couplers, a power supply capable of functioning is absolutely required. In this previously known state of the art, the error message is issued to the error indicating line as a static signal, i.e. the potential of the error indicating line is changed between a first value and a second value when an error occurs, and remains at this second value for the duration of the error. It is disadvantageous, in this connection, that the error indication does not allow any statement concerning the type of error, so that it was not possible to evaluate whether this is a serious error and what the reason for the occurrence of the error might be.

SUMMARY OF THE INVENTION

The invention is based on the task of creating a circuit assembly for error indicating that does not have the defects described, and that particularly signals failure of the operating voltage of the coupler.

The stated task is accomplished, in the case of a circuit configuration for error indicating, of the type indicated initially, in that a connection circuit is provided between coupler and error indicating line, which places the error indicating line at a predetermined potential, the error report potential, if the operating voltage of the coupler is insufficient, and that the connection circuit can furthermore be controlled by the coupler, in such a manner that if the signal transmitter issues an error signal, the connection circuit places the error signal onto the error indicating line.

In detail, the connection circuit has a junction field effect transistor (J-FET), which is normally conductive and whose control gate is connected with the controlled branch of the coupler, so that it is more or less brought into the blocked state when a positive signal that controls the coupler is issued. In general, switching operation of the J-FET is preferred. This means that the output of the J-FET, which lies in series with the current feed resistor and a ground feed resistor, is pulled either to operating voltage (there is no error) or to ground potential (there is an error).

The connection circuit is preferably plugged together with a bus that has multiple lines, and comprises, aside from the operating voltage line and the error indicating line, also a ground line and, if necessary, a general alarm line.

The circuit configuration can also comprise an error signaling device that issues an optical and/or acoustical signal when an error occurs. The error signaling device can be assigned to the error indication evaluation device or to the general alarm line.

The signal transmitter can be programmed for coding the type of error that has occurred into the error signal. Furthermore, the circuit assembly for error indicating is able to report an insufficient operating voltage of the coupler. These two types of defects are recognized as such by the error indication evaluation device, and stored in memory, if necessary, in order to give the technician an indication of the cause of the defect and thus to shorten the repair time.

BRIEF DESCRIPTION OF THE DRAWINGS

The FIGURE depicts the circuit assembly of the illustrative embodiment.

DETAILED DESCRIPTION

An exemplary embodiment of the invention will be described using the drawing.

The main components of the circuit configuration for error indicating are the following:

A signal transmitter 1 for issuing error signals, an optical coupler 2, a connection circuit 3, a T bus 4, an operating voltage source 5 as the power supply, an error indication evaluation device 6, and an error signaling device 7.

The signal transmitter 1 contains a so-called bus bar with monitoring modules connected with it, for determining individual errors of the system that the signal transmitter 1 is supposed to monitor. The monitoring modules can be configured for determining internal errors in various modules of the system, for example incorrect poling, power failure, interruption, short circuit, lead break, and it is also possible to determine that a measurement value has been exceeded or not reached. Possible construction methods of the monitoring modules are NAMUR switches, valve cut-offs, input cut-offs and feed cut-offs. The signal transmitter 1 can comprise a computer, not shown, for providing digital data as coded error signals. If a module in the monitored system fails completely, the monitoring module in question causes the signal transmitter 1 to issue "low" potential. If the monitoring module finds a line error in the system, issuance of a corresponding coded error signal is brought about, e.g. at 1 kHz cycle. If the monitoring module finds an internal error in one of the modules, issuance of a corresponding coded error signal, e.g. at 2 kHz cycle, is brought about. If blinking signals are to be produced, coded error signals, e.g. at 1.2 kHz and 2.4 kHz, are possible. In this way, a suitable error signal can be assigned to each error type, with not only the frequency but also the voltage level or current level and the sampling ratio $T_i/T_p$ (i=on, p=pause) being decisive.

The error signals are delivered to the input branch of the coupler 2 by way of the output line of the signal transmitter 1, which contains a resistor $R_1$. The coupler contains a light-emitting diode $D_2$ in the input branch and a transistor $T_2$ that responds to light in the output branch. This output branch is supplied with current by the operating voltage source 5, which current flows to ground by way of a resistor $R_2$. The resistor $T_2$ forms a lesser or greater current resistance as a function of the light status of the diode $D_2$, so that a potential close to the operating voltage or close to ground potential is adjusted at the output $A_2$ of the transistor $T_2$ if the transistor $T_2$, as is usual, is operated as a switch.

The connection circuit 3 comprises a junction field effect transistor $J_3$ that is connected with the operating voltage source 5 by way of a resistor $R_3$ and with ground by way of a diode $D_3$ and by way of a resistor $R_4$. The control electrode of the J-FET $J_3$ stands in a conductive connection with the output $A_2$ of the coupler 2, thereby controlling the J-FET $J_3$ in the cycle of the signal at $A_2$. The J-FET $J_3$ is self-conductive, and is switched to the T bus 4 as an open collector output.

The connection circuit 3 has a switching point $A_3$ that is connected with the error report evaluation device 6. The lead of the T bus 4 called the bus foot Pin 3, which represents an error indicating line, is used for this purpose. The T bus 4, with its Pin 1, furthermore comprises a lead 45 for a connection with the power supply 5, and, with its Pin 2 or 4, another lead, not shown, for a connection of the corresponding circuit parts with ground.

The error indication evaluation device 6 comprises signal detectors, not shown, for the types of error signals, in each instance, and a memory for storing the point in time and the type of error that has occurred. The error indication evaluation device 6 can also comprise the error signaling device 7, which here, for reasons of clarity, has been shown as being connected with a collecting alarm line 47, can contain a dropping resistor $R_7$, and is supplied by way of a voltage source $V_7$. There is a possibility of making a direct connection of the error signaling device 7 with the lead 46 or 47.

The diode $D_3$ prevents the voltage $V_7$ from blocking the J-FET $J_3$. There is also the possibility of galvanic separation, as indicated schematically by the switch S7. (The switch S7 could be implemented by means of another optical coupler.) When the error indication evaluation device 6 receives an error message, the switch $S_7$ is closed, and therefore a circuit is also closed to ground.

The following should be noted with regard to the operation of the circuit:

The circuit configuration sets itself to error indicating if the operating voltage supply 5 fails or if it keeps an overly low voltage available, or if the signal transmitter 1 does not issue a positive signal at one of its ports. The J-FET $J_3$ is normally conductive, but it is switched into the blocked state by means of the positive signal voltage of the signal transmitter 1.

If the operating voltage of the power supply 5 is eliminated or becomes too low, the voltage at the switching point $A_3$ drops and reaches almost ground potential. This means, however, that the error indicating line 46 reports this type of error as a constant error indication potential. Thus, an insufficient operating voltage is reported to the error indication evaluation device 6.

If the power supply 5 carries a regular high operating voltage and the signal transmitter 1 issues an error signal, the signal voltage issued is "low" (zero at least part of the time), and the normally conductive J-FET $J_3$ is conductive, which brings the switching point $A_3$ to ground potential. Thus, the error indication line 6 carries ground potential at least part of the time. The received, coded error signals are evaluated as an error report by the error indication evaluation device 6. If the error signaling device 7 is provided, occurrence of the error is signaled immediately. Otherwise, the type and time of occurrence of the error are recorded, in order to be available during error search and repair.

What is claimed is:

1. A circuit assembly for error indicating, comprising:
    a signal transmitter for issuing error signals;
    an error indicating line that is connected with an error indication evaluation device;
    a coupler for galvanic separation of the error indicating line from the signal transmitter;
    a power supply for providing an operating voltage for the coupler; and
    a connection circuit between the coupler and the error indicating line, which places the error indicating line at a predetermined potential, the error indication potential, when the operating voltage of the coupler is insufficient;
    wherein the connection circuit is controllable by the coupler, in such a manner that when the signal transmitter issues an error signal, the connection circuit places the error signal onto the error indicating line;
    wherein the connection circuit comprises a function field effect transistor (J-FET) that is normally conductive, and whose control gate is connected with a controlled branch of the coupler, in order to be brought into a blocked state when a positive signal that controls the coupler is issued;
    wherein the J-FET lies in series with a current feed resistor and a mass feed resistor, to which the controlled branch of the coupler and another mass feed resistor lie in parallel, where the error indicating line is connected with the connection circuit, between the current feed resistor and the J-FET;
    wherein an error signaling device is connected at an output of the connection circuit; and
    wherein the error signaling device includes a dropping resistor and a switch that is adapted for galvanic separation.

2. The circuit assembly according to claim 1, wherein the connection circuit can be plugged together with a bus that has multiple lines, where one of the lines, an operating voltage line, carries the operating voltage, and another of the lines represents the error indicating line.

3. The circuit assembly according to claim 2, wherein the bus to the operating voltage line and the error indicating line furthermore comprises a ground line, and wherein a collecting alarm line is provided.

4. The circuit assembly according to claim 1, wherein the signal transmitter issues coded error signals for identifying an error that occurs, and that the error indication evaluation device stores such error signals that occur in memory.

5. The circuit assembly according to claim 4, wherein the coded error signals are provided for identifying internal errors in a module, incorrect poling, power failure, interruption, short circuit, lead break, or whether a measurement value has been exceeded or not reached.

* * * * *